United States Patent [19]
Lin

[11] Patent Number: 6,015,642
[45] Date of Patent: Jan. 18, 2000

[54] METHOD FOR FORMING A PHOTOMASK

[75] Inventor: Benjamin Szu-Min Lin, Chiayi, Taiwan

[73] Assignee: United Microeletronics Corp., Hsinchu, Taiwan

[21] Appl. No.: 09/197,271

[22] Filed: Nov. 20, 1998

[51] Int. Cl.[7] ...................................................... G03F 9/00
[52] U.S. Cl. .................................................................. 430/5
[58] Field of Search ................................ 430/5, 322, 323, 430/324, 394; 378/35

[56] References Cited

U.S. PATENT DOCUMENTS 5,422,206   6/1995   Kamon ........................................ 430/5

*Primary Examiner*—S. Rosasco
*Attorney, Agent, or Firm*—Hickman Stephens & Coleman, LLP

[57] ABSTRACT

A fabrication process for a multi-layer photomask. A transparent substrate is provided. An anti-reflecting layer is formed on the substrate. First blinding blocks are formed on the anti-reflecting layer by defining a first blinding layer. A transparent layer is formed along the profile of the structure surface described above. Second blinding blocks are formed on the transparent layer between the first blinding blocks by defining a second blinding layer, wherein a part of the transparent layer on the first blocks is exposed.

11 Claims, 3 Drawing Sheets

METHOD FOR FORMING A PHOTOMASK

BACKGROUND OF THE INVENTION

1. Field of the Invention

This invention relates to a method for forming a photomask, and more particularly to and a fabrication process for a multi-layer photomask, which has a pattern with a narrow line width and a small pitch between lines.

2. Description of the Related Art

In a photolithography process, photomask is the main tool used to transfer a circuit pattern onto a wafer, so the photomask consequently plays an essential role in semiconductor fabrications. The main part of the photomask is a planar, transparent substrate. A circuit pattern is formed by a chromium layer that is about several hundred Å thick, which chromium layer includes a pattern desired to cover a portion of the transparent substrate. An anti-reflection layer is often formed on the chromium to prevent light from being reflected by the chromium layer. When the photomask is exposed to a light source, a circuit pattern is projected onto the wafer.

FIG. 1 is a cross-sectional view showing a conventional binary mask. A typical binary mask comprises a transparent substrate 10 and a defined blinding layer 12. A material of the blinding layer 12 comprises chromium, iron oxide ($FeO_x$), silicon nitride or aluminum (Al).

Another conventional photomask is known as a "phase shifting mask (PSM)". Typically, there are two kinds of phase shifting mask. One is a strong PSM and the other is a weak PSM. The strong PSM further includes a Levenson and an alternating PSM. The weak PSM comprises a half-tone PSM, a rim PSM and an attenuated PSM. FIG. 2 is a cross-sectional view showing a conventional half-tone PSM (HTPSM). Normally, a HTPSM, which has a larger depth of focus than other types of PSM, is used to produce hole patterns for semiconductor devices on a wafer.

In FIG. 2, a defined shifting layer 22 is formed on a portion of a provided transparent substrate 20. Hole patterns are thus formed on the exposed transparent substrate 20. The shifting layer 22 can generate a 180° phase shift in incoming light. The light transparency of this shifting layer 22 is roughly between 3–10%. The HTPSM operates by shifting incoming light through phase angles of 0° and 180°, alternately.

The patterns of a photomask are drawn with an e-beam or laser. The size of pitches between the patterns is limited by the resolution of the e-beam or of the laser. One method of decreasing the pitches is to use an advanced machine to enhance the resolution but this method does increase the cost of forming a photomask.

SUMMARY OF THE INVENTION

It is therefore an object of the invention to provide a fabrication process for a multi-layer photomask. The multi-layer photomask has narrow pitches between patterns of the photomask. Furthermore, an advanced machine is not required to form the photomask.

The invention achieves the above-identified objects by providing a method for forming a multi-layer photomask. A transparent substrate is provided. An anti-reflecting layer is formed on the substrate. First blinding blocks are formed on the anti-reflecting layer by defining a first blinding layer. A transparent layer is formed along the profile of the structure surface described above. Second blinding blocks are formed on the transparent layer between the first blinding blocks by defining a second blinding layer, wherein a part of the transparent layer on the first blocks is exposed.

BRIEF DESCRIPTION OF THE DRAWINGS

Other objects, features, and advantages of the invention will become apparent from the following detailed descriptions of the preferred but non-limiting embodiments. The description is made with reference to the accompanying drawings in which.

DESCRIPTION OF THE PREFERRED EMBODIMENT

Figure 1:
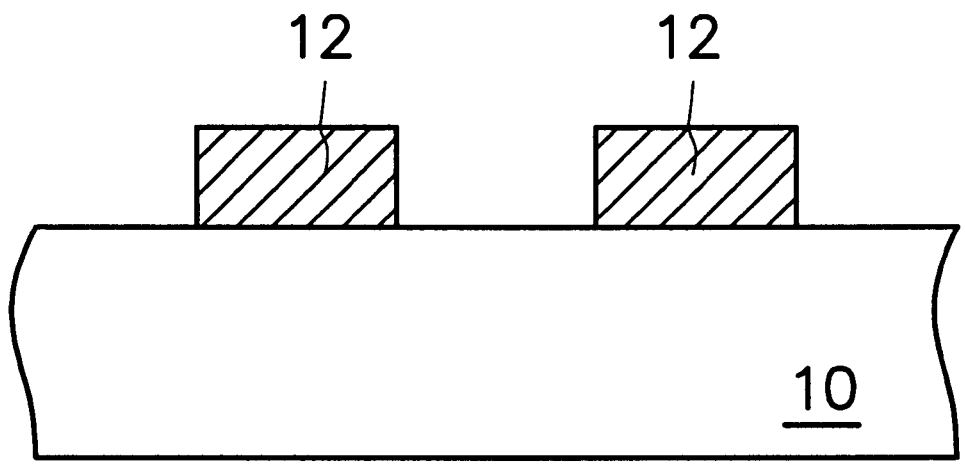
FIG. 1 is a schematic, cross-sectional view showing a conventional binary mask.
Figure 2:
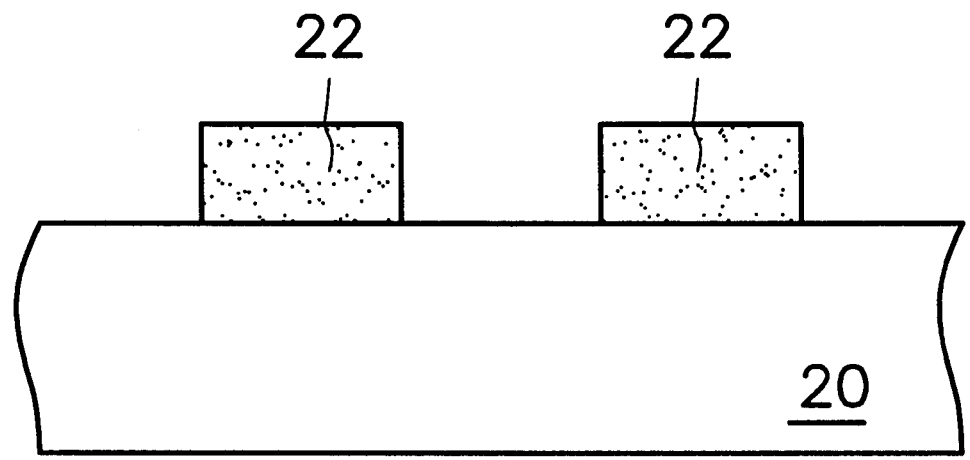
FIG. 2 is a schematic, cross-sectional view showing a conventional half-tone phase shifting mask.
Figure 3A:
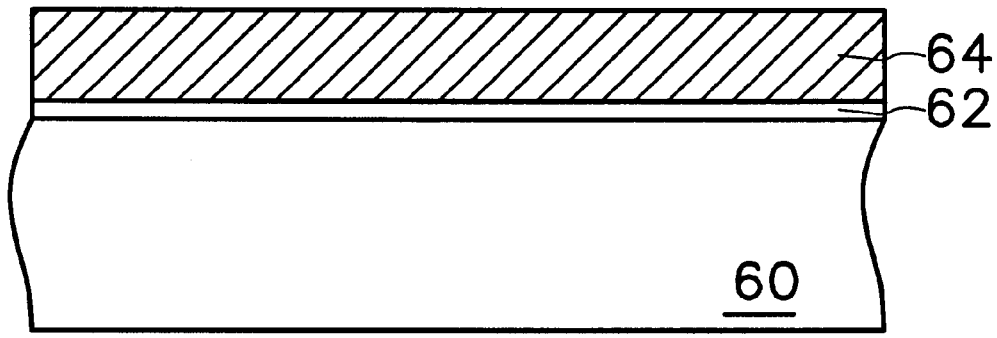
FIGS. 3A–3D are schematic, cross-sectional views showing a multi-layer photomask according to one preferred embodiment of the invention.

In FIG. 3A, a transparent substrate 60, such as a quartz substrate, is provided. An anti-reflecting layer 62, such as a chromium dioxide layer, is formed on the transparent substrate 60. The anti-reflecting layer 62 is used to prevent light from reflecting while performing an exposure process. A first blinding layer 64, such as a chromium layer, is formed on the anti-reflecting layer 62. The first blinding layer 64 is formed, for example, by sputtering or chemical vapor deposition (CVD).

Figure 3B:
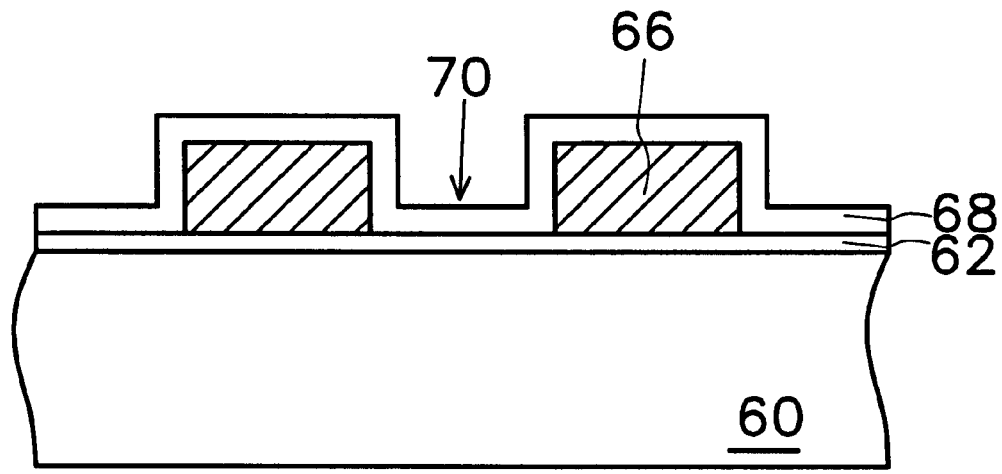

In FIG. 3B, the first blinding layer 64 is defined to form blinding blocks 66. A transparent layer 68 is formed on the surface of the blinding blocks and the surface of the exposed anti-reflecting layer 62. The transparent layer 68 is formed, for example, by CVD. Grooves 70 are thus formed between the blinding blocks 66. The transparent layer 68 may be a conformal layer, or formed by depositing a thick transparent material on the blinding blocks 66 and the anti-reflecting layer 62 and partially etching the thick transparent material to form the grooves 70.

Figure 3C:
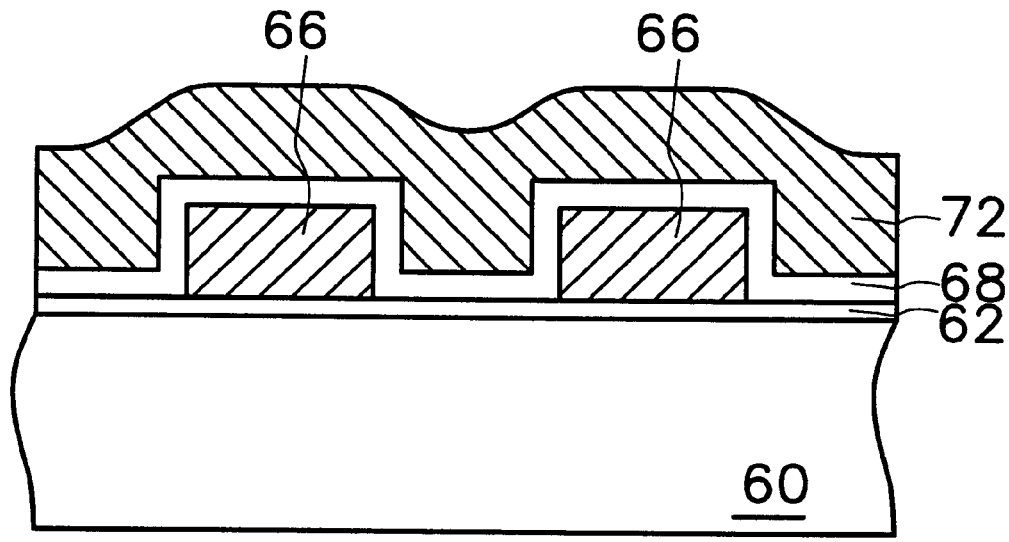

In FIG. 3C, a second blinding layer 72 is formed on the transparent layer 68 shown in FIG. 3B. The second blinding layer 72 is formed, for example, by CVD.

Figure 3D:
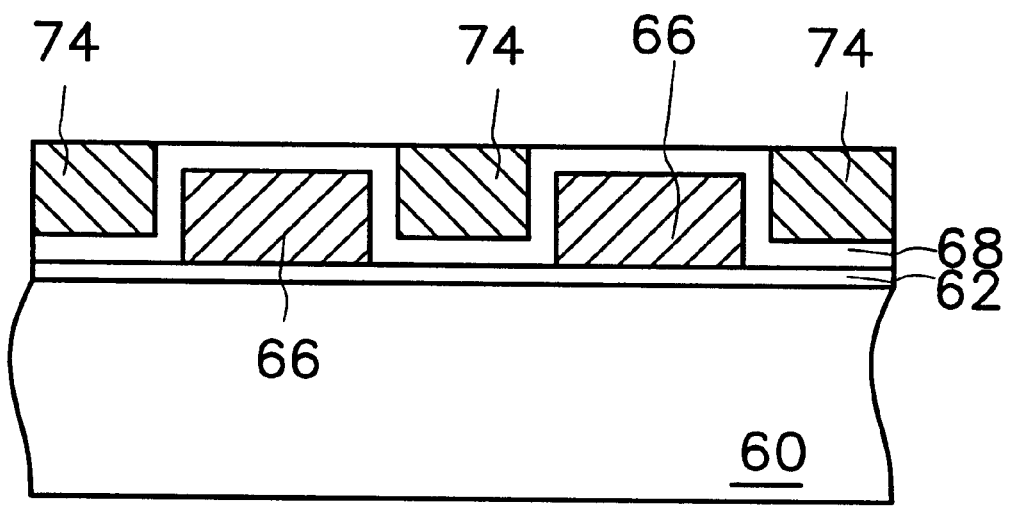

In FIG. 3D, a part of the second blinding layer 72 is removed, for example, by CMP. At this step, the transparent layer 68 on the position of the first blinding blocks 66 is exposed. Therefore, second blinding blocks 74 are formed in the grooves 70 between the first blinding blocks 66. The first blinding blocks 66 and the second blinding blocks 74 cross up and down. A photomask is thus formed.

The material of the first blinding blocks 66 and the material of the second blinding blocks 74 are the same. Light can not pass through the first blinding blocks 66 and the second blinding blocks 74, or only 3–10% of the light passes through those with a 180° phase shift. If light only passes through regions between the first blinding blocks 66 and the second blinding blocks 74, the photomask is a binary mask. If light passes through the regions between the first blinding blocks 66 and the second blinding blocks 74 and 3–10% of light also passes through the first blinding blocks 66 and the second blinding blocks 74 and has a 180° phase shift, the photomask is a half-tone phase shifting mask.

One feature of the invention is that pitches between the blinding blocks, which are crossed up and down, can be adjusted by controlling the thickness of the transparent layer.

Another feature of the invention is that the pitches of the photomask from the invention are shorter the pitches of a conventional photomask. A more highly integrated pattern is obtained while performing a photolithography and etching process.

While the invention has been described by way of example and in terms of a preferred embodiment, it is to be understood that the invention is not limited thereto. To the contrary, it is intended to cover various modifications and similar arrangements and procedures, and the scope of the appended claims therefore should be accorded the broadest interpretation so as to encompass all such modifications and similar arrangements and procedures.

What is claimed is:

1. A method for forming a photomask, comprising the steps of:

providing a transparent substrate;

forming an anti-reflecting layer on the transparent layer;

forming a first blinding layer on the anti-reflecting layer;

removing a part of the first blinding layer to form first blinding blocks and to expose a part of the anti-reflecting layer;

forming a conformal transparent layer on the first blinding blocks and the exposed anti-reflecting layer;

forming a second blinding layer on the transparent layer; and removing a part of the second blinding layer to form second blinding blocks between the first blinding blocks and to expose the transparent layer on the position of the first blinding blocks.

2. The method according to claim 1, wherein the transparent substrate comprises a quartz substrate.

3. The method according to claim I, wherein the anti-reflecting layer comprises a chromium dioxide layer.

4. The method according to claim 1, wherein the first blinding layer and the second blinding layer are formed by sputtering.

5. The method according to claim 1, wherein the first blinding layer and the second blinding layer are formed by chemical vapor deposition.

6. The method according to claim 1, wherein light cannot pass through the first blinding layer and the second blinding layer.

7. The method according to claim 1, wherein only 3–10% of the light can pass through the first blinding layer and the second blinding layer with a 180° phase shift.

8. A method for forming a photomask, comprising the steps of:

providing a transparent substrate;

forming first blinding blocks on the transparent substrate and exposing a part of the transparent substrate;

forming a conformal transparent layer on the first blinding blocks and the exposed transparent substrate;

forming second blinding blocks on the transparent substrate between the first blinding blocks and exposing the transparent layer on the position of the first blinding blocks.

9. The method according to claim 8, wherein the transparent substrate comprises a quartz substrate.

10. The method according to claim 8, wherein light can not pass through the first blinding blocks and the second blinding blocks.

11. The method according to claim 8, wherein only 3–10% light can pass through the first blinding blocks and the second blinding blocks with a 180° phase shift.

* * * * *